United States Patent
Kuribayashi et al.

(10) Patent No.: US 6,607,593 B2
(45) Date of Patent: Aug. 19, 2003

(54) METHOD OF MANUFACTURING A MONO-CRYSTALLINE SILICON BALL

(75) Inventors: Kazuhiko Kuribayashi, Sagamihara (JP); Tomotsugu Aoyama, Tsuchiura (JP)

(73) Assignee: Agency of Industrial Science and Technology, Tokyo (JP)

(*) Notice: Subject to any disclaimer, the term of this patent is extended or adjusted under 35 U.S.C. 154(b) by 193 days.

(21) Appl. No.: 09/917,063

(22) Filed: Jul. 27, 2001

(65) Prior Publication Data

US 2002/0182875 A1 Dec. 5, 2002

(30) Foreign Application Priority Data

May 25, 2001 (JP) ........................................ 2001-156689

(51) Int. Cl.⁷ .................................................. C30B 9/04
(52) U.S. Cl. ............................. 117/11; 117/12; 117/75; 117/902; 117/920; 117/931
(58) Field of Search ............................ 117/11, 12, 931, 117/901, 902, 920, 75

(56) References Cited

U.S. PATENT DOCUMENTS

| | | | |
|---|---|---|---|
| 4,637,855 A | * | 1/1987 | Witter et al. ................ 117/931 |
| 5,069,740 A | * | 12/1991 | Levine et al. ................ 117/931 |
| 5,431,127 A | * | 7/1995 | Stevens et al. ................ 117/75 |
| 6,074,476 A | * | 6/2000 | Hanabe et al. ................ 117/11 |
| 6,080,954 A | * | 6/2000 | Inoue et al. ........... 219/121.36 |
| 6,264,742 B1 | * | 7/2001 | Vekris et al. ................ 117/204 |
| 6,432,330 B1 | * | 8/2002 | Hanabe et al. .................. 264/9 |

FOREIGN PATENT DOCUMENTS

JP 11-12091 A1 1/1999

* cited by examiner

*Primary Examiner*—Robert Kunemund
(74) *Attorney, Agent, or Firm*—Webb Ziesenheim Logsdon Orkin & Hanson, P.C.

(57) ABSTRACT

When a crystalline nucleus generated from an under-cooled silicon droplet is grown up to a mono-crystalline silicon ball, a critical under-cooling $\Delta T_{cr}$ is determined in response to a diameter d of the silicon droplet so as to satisfy the relationships of (d=5 mm, $\Delta T_{cr}$=100K), (d=3 mm, $\Delta T_{cr}$=120K) and (d=1 mm, $\Delta T_{cr}$=150K). A crystal grown up from the crystalline nucleus at an under-cooling $\Delta T$ less than the critical under-cooling $\Delta T_{cr}$ is a mono-crystalline silicon ball with high quality free from cracks or twins.

2 Claims, 3 Drawing Sheets

METHOD OF MANUFACTURING A MONO-CRYSTALLINE SILICON BALL

BACKGROUND OF THE INVENTION

1. Field of the Invention

The present invention relates to a method of manufacturing a mono-crystalline silicon ball useful as a substrate for semiconductor devices.

2. Description of the Prior Art

A utility of silicon wafers as representative semiconductor material becomes stronger and stronger in correspondence to development and spread of semiconductor devices in various industrial fields. Since a silicon wafer bigger in diameter is profitable for fabrication of semiconductor devices with higher production efficiency, silicon wafers of 300 mm in diameter has been used. Production of silicon wafers of 400 mm in diameter is also researched. However, the tendency to enlargement of wafers in diameter would be doubtful, accounting the economical point of view that a plant designed for production of such big wafers is very expensive.

There is a concept directed to use a mono-crystalline silicon ball of about 1 mm in diameter, on the contrary to enlargement of silicon wafers. In fact, an integrated circuit designed on a surface of such a mono-crystalline silicon ball is researched and examined on applicability as a low-cost next-generation IC to a micro-machine or the like. A mono-crystalline silicon ball has been produced so far by a high-frequency plasma method, a rotary disk method, a gas-atomizing method, a water-atomizing method, an argon-arc rotary electrode method, a plasma-arc rotary electrode method, etc. For instance, JP 11-12091 A1 discloses a mono-crystalline silicon ball manufacturing method, wherein spheroidal poly-crystalline silicon covered with oxide film is partially melted with heat and then re-crystallized to a spheroidal shape while shifting the molten part.

It is a big problem how to prepare mono-crystalline silicon in a spheroidal shape at a low cost. A manufacturing method, which fulfills industrial productivity, has not been established yet. There are many unknown matters on progress of crystallization together with reproducibility, when a mono-crystalline silicon ball is produced with use of a drop tube or by an atomizing method, so that many problems necessary for improvement of productivity are still unsettled. The present invention is accomplished to overcome the above-mentioned problems.

SUMMARY OF THE INVENTION

The present invention aims at production of a mono-crystalline silicon ball directly from an under-cooled droplet by properly controlling under-cooling of the droplet. An effect of the under-cooling on crystallizing the droplet to a spheroidal shape is discovered by the inventors from studies on re-crystallization of an under-cooled droplet.

The present invention proposes a new method, whereby a mono-crystalline silicon ball is manufactured from under-cooled silicon melt suspending a crystalline nucleus therein under the condition that a critical under-cooling $\Delta T_{cr}$ is determined in correspondence with a diameter d of a silicon droplet so as to satisfy relationships of (d=5 mm, $\Delta T_{cr}$=100K), (d=3 mm, $\Delta T_{cr}$=120K), and (d=1 mm, $\Delta T_{cr}$=150K) between the critical under-cooling $\Delta T_{cr}$ and the diameter d.

DETAILED DESCRIPTION OF THE PREFERRED EMBODIMENTS

The inventors have researched and investigated on generation of a solidification nucleus from silicon melt, and discovered that growth of crystals is differentiated in response to under-cooling of the droplet. The present invention is accomplished on the basis of the newly discovered relationship between the under-cooling and the shape of the mono-crystalline silicon. A mono-crystalline silicon ball with high quality is produced by properly controlling the under-cooling $\Delta T$ in correspondence with a diameter d of a silicon droplet. Moreover, a mono-crystalline silicon ball bigger in diameter can be manufactured, since conditions for mono-crystallization is greatly relaxed.

The other features of the present invention will be apparent from the following example.

EXAMPLE

A silicon sample, which corresponded to a droplet of 5 mm or less in diameter, was prepared by crushing a poly-crystalline silicon block of purity 99.999%.

After the sample was located in a chamber, the chamber was evacuated to $10^{-4}$ Pa or so by a turbomolecular pump. An atmosphere of the chamber was substituted with argon gas having $O_2$ content controlled less than 0.02 ppm, and the argon gas was continuously supplied as such at a constant flow rate. Thereafter, the sample was pre-heated up to a temperature (~1500K), at which silicon turned to a state having enough electric conductivity, by irradiation with $CO_2$ laser beam. An electro-magnetic force of 200 kHz was impressed on the pre-heated sample. The sample melted was a small droplet of 5 mm or less in diameter, which was floatable due to impression of the high frequency energy.

The levitated droplet was cooled by supply of cooling He gas, while its temperature was adjusted by controlling power of the laser beam and a flow rate of the cooling He gas. Under these conditions, a crystal growth velocity was measured, and a solid/liquid interface was observed. The crystal growth velocity was measured by use of a high-speed video camera, whose sampling rate was 40,500 frames/second, together with a photo diode. A shape of the solid/liquid interface was judged from images of the video camera.

A levitated droplet with an arbitrary under-cooling was dropped on a chilling Cu plate and abruptly solidified thereon. This droplet was subjected to the observation of interface morphology.

The inventors researched an effect of an under-cooling $\Delta T$ on a crystal growth velocity V under these conditions.

Figure 1:
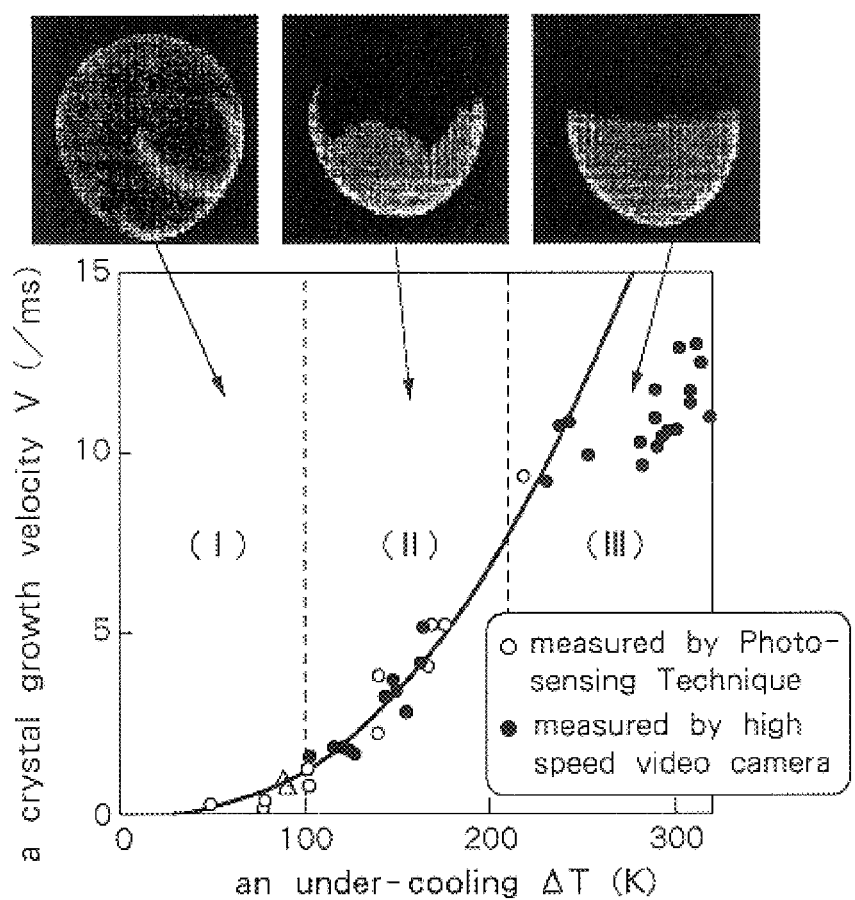
FIG. 1 is a graph showing an effect of an under-cooling $\Delta T$ of a silicon droplet on a growth velocity V of a crystalline nucleus.

Results, as shown in FIG. 1, prove that the crystal growth velocity V was varied according to the under-cooling ΔT. It is understood that the under-cooling was divided into three regions I–III in response to shapes of a solid/liquid interface. A plate-like crystal was observed in the region I, a coarse facet dendrite was observed in the region II, and a fine facet dendrite was observed in the region III.

A crystal growth velocity V was detected by plotting movement of a tip of the plate-like crystal in the region I, movement of a tip of the facet dendrite in the region II and movement of the solid/liquid interface, which was estimated as a macroscopic smooth plane, in the region III. For comparison, a theoretical value of a growth velocity, which was calculated on the basis of an LKT model, is also shown by the solid line in FIG. 1.

In the LKT model, a total under-cooling ΔT for growth of a single phase is represented by $\Delta T = \Delta T_t + \Delta T_r + \Delta T_c + \Delta T_k$. In the formula, $\Delta T_t$ is a thermal under-cooling and replaced by the following formula with the assumption that the dendrite is rotationally paraboloidal at its tip.

$$\Delta T_t = \frac{\Delta H_f}{C_p} P_t \exp(P_t) E_1(P_t) \equiv \Delta T_{hyp} Iv(P_t)$$

$E_1$ is an exponential integral function, and represented by the following formula.

$$E_1 = \int_{P_t}^{\infty} \frac{\exp(-z)}{z} dz$$

$P_t$ (=$VR/2a_1$) is a thermal Peclae's number given as a ratio of a product of the growth velocity V with a radius R of the tip of the dendrite to a thermal diffusivity $a_1$. $I_v$ is an Ivantsov's function. A ratio $\Delta T_{hyp}$ of a fusion enthalpy $\Delta H_f$ to a specific heat $C_p$ corresponds to a hyper-cooling limit. $\Delta T_r$ is an under-cooling caused by Gibbs-Thomson effect represented by $\Delta T_r = 2\Gamma/R$. A Gibbs-Thomson coefficient $\Gamma$ is given as a ratio $\sigma/\Delta S_f$ of an interfacial energy σ to a fusion entropy $\Delta S_f$.

In an alloy system wherein solute atoms or molecules are re-distributed at a solid/liquid interface, under-cooling caused by deviation of composition shall be taken into consideration. Such the under-cooling $\Delta T_c$ is given by the following formula.

$$\Delta T_c = mc_0 \left[ \frac{1}{1-(1-k)Iv(P_c)} - 1 \right]$$

In the formula, m is the slope of a liquidus line, $c_o$ is a bulk concentration, $I_v(P_c)$ is an Ivantsov's function given by a solute Peclae's number $P_c$(=$VR/2D$, wherein D is a diffusion coefficient of the solute). $\Delta T_k$ is an under-cooling caused by interfacial kinetics given by $\Delta T_k = V/\mu$ (μ is a kinetic coefficient).

Since a product of V and R is given as a function of ΔT from the formula of $\Delta T = \Delta T_t + \Delta T_r + \Delta T_c + \Delta T_k$, another condition is necessary to separate V and R from each other. The following criterion, which is based on a marginal stability criterion formulated by Langer and Mueller-Krumbhaar (issued by Acta Metall. 26(1978), 1681), is often used for a rough interface. Said criterion is also used in the present invention.

$$\sigma^* = \frac{2\sigma T_E C_p a_l}{\Delta H_f^2 R^2 V} = \frac{1}{4\pi^2}$$

The under-cooling $\Delta T_c$ can be omitted, in this example directed to a growth process of a pure material. In this sense, the total under-cooling ΔT can be assumed to a sum of the thermal under-cooling $\Delta T_t$, a curvature under-cooling $\Delta T_r$ derived from Gibbs-Thomson effect and a kinetics under-cooling $\Delta T_k$. On the calculation, a coefficient μ of interface attachment kinetics was used as a parameter to fit measured values to the LKT model.

It is understood from FIG. 1 that the measured values are well consistent with the LKT model in the regions I and II, while there is apparent deviation of the measured values from the LKT model in the region III.

The inventors presumes the reason of such the deviation as follows: An effect of an under-cooling on a shape of a solid/liquid interface during solidification of silicon melt is different from an ordinary effect during solidification of close-packed metal, in the manner such that a solid/liquid interface changes from a plate-like crystal or a facet dendrite to a continuous plane in the region III with a high under-cooling ΔT. A planar orientation of the plate-like crystal distinctly suggests a singular plane {111} whose growth is controlled by incorporation of atoms to a step.

Figure 2A:
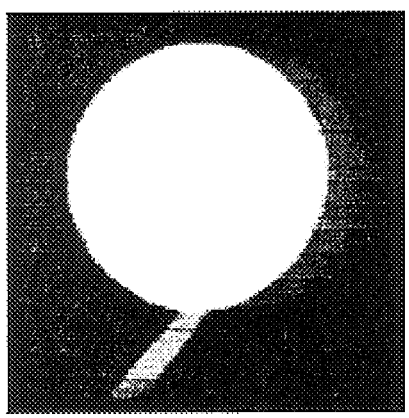
FIG. 2A is a photograph showing seeding with a {111} <110>seed crystal of silicon wafer.
Figure 2B:
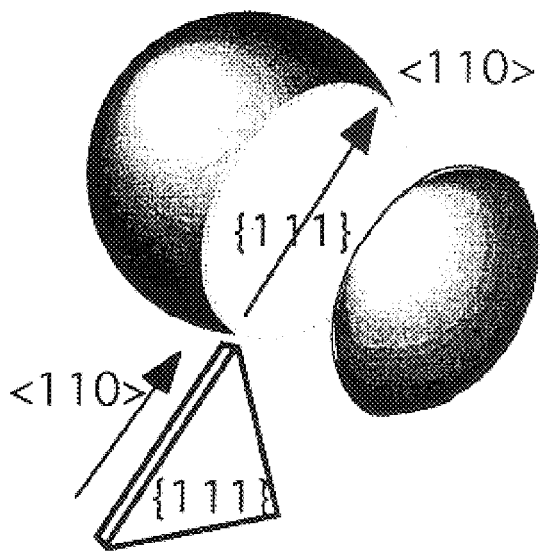
FIG. 2B is a view illustrating a model for explanation of seeding with a {111} <110>seed crystal.
Figure 3:
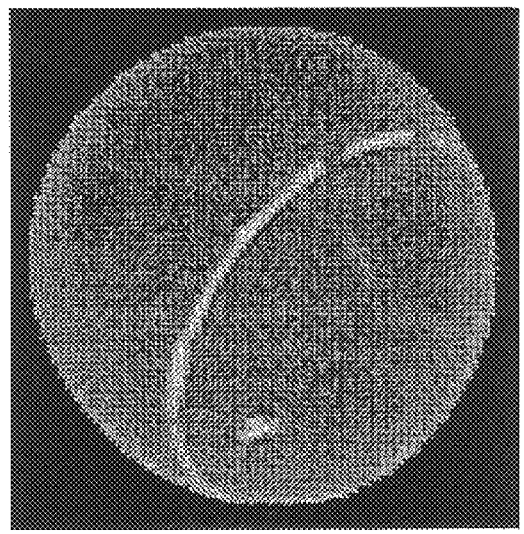
FIG. 3 is a photograph of silicon crystallized as a thin plate in a region I observed with a high-speed video camera.

In actual, progress of crystallization in a plate-like state parallel to a mono-crystalline seed was observed on a surface of a droplet, as shown in FIG. 2, in the case where the droplet was seeded with the mono-crystalline seed having a crystal plane {111} and an edge <111>. Epitaxial growth of the plate-like crystal from the seeding position toward the inside but not toward the surface of the droplet is suggested by a discontinuous periphery of the plate-like crystal, as shown in FIG. 3. These results prove that a levitated droplet can be crystallized to a mono-crystalline state by maintaining such the conditions of epitaxial growth.

Although a droplet is solidified to a plate-like state in the region I quite different from a facet dendrite in the region II, the same model is available for analysis of a crystal growth velocity in both the regions I and II. Availability of the same model to both the regions I and II means that a tip of growth (i.e. an edge of a plate-like crystal in the region I and a tip of a facet dendrite in the region II) is rough and consistent with the LKT model. That is, change of the morphology from plate-like crystal to facet dendrite is probably derived from destabilizing of the edge of the plate-like crystal or the tip of the facet dendrite, without transition from lateral growth to continuous growth. In other words, solidification from under-cooled silicon melt with an under-cooling ΔT<200K is derived from crystal growth caused by adsorption of silicon atoms to a planar interface, and there is no transition from lateral growth to continuous growth.

The epitaxial growth means stability at the edge of the plate-like crystal in the region I and at the tip of the facet dendrite in the region II. In this sense, conditions for the epitaxial growth shall be clarified in order to promote growth of a mono-crystal from the under-cooled droplet. The inventors studied progress of plate-like crystal growth and researched for conditions necessary for stabilization of the edge of the plate-like crystal and the tip of the facet dendrite.

Semiconductor material such as Si or Ge has the feature that its solid/liquid interface becomes a facet plane during crystal growth. The facet plane is composed of many singular planes with low indices, typically a plane {111} of Si. In the case where facet growth occurs in a semiconductor melt, the growth can be explained by movement of steps on the singular plane. When an under-cooling ΔT is small, a growth velocity v along a normal direction is represented by $v=\beta_{st} p \Delta T_k$, wherein $\beta_{st}$ is a kinetic coefficient of a step, and p is a step-density. Since the step-density p is inversely proportional to spacing in the step, it increases as deviation of a planar orientation of an solid/liquid interface from an orientation of the singular plane.

A microscopic shape of a crystalline nucleus is approximated with a sphere due to Gibbs-Thomson effect on occurrence of a minute crystalline embryo in an under-cooled liquid. But, a growth velocity is differentiated in response to a step-density p in progress of crystal growth, when {111} is destined as a singular plane. With the presumption that a horizontal interface, on which the step-density p diverges, is a rough plane, the crystalline nucleus changes its shape from a sphere to a flat oval and finally to a thin plate of {111}. Consequently, thickness L of the plate-like crystal is represented by the formula (1), wherein $d_n$ is a diameter of the crystalline nucleus, and $t_0$, which is a time period for tracing a sample with the plate-like crystal, is represented by the formula (2).

$$L = d_n + \int_0^{t_0} v dt \quad (1)$$

$$t_0 = d_0 / \mu \Delta T_k \quad (2)$$

When the step-density p is calculated by a screw dislocation-controlled crystal growth model represented by the formula (3), the formula (1) is converted to the formula (4), wherein $d_0$ is a diameter of the sample, α is a ratio ($\alpha = \beta_{st}/\mu$, α<1) of a kinetic coefficient $\beta_{st}$ of the step to a coefficient $\mu$ of interface attachment kinetics.

$$p = \frac{h_{st} \Delta T_k}{19 T_M \Gamma_k} \quad (3)$$

$$L \cong \alpha d_0 p = \frac{\alpha d_0 h_{st} \Delta T_k}{19 T_M \Gamma_k} \quad (4)$$

Figure 4:
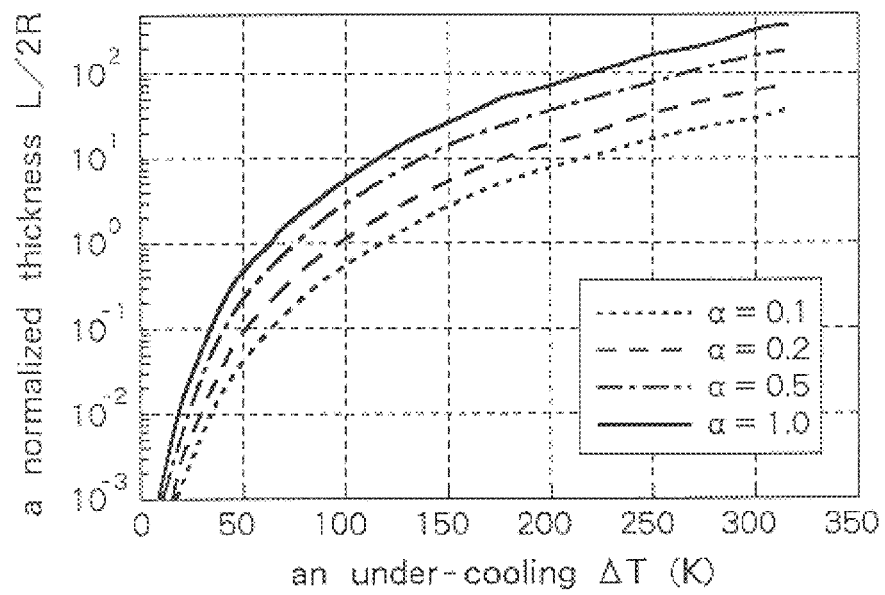
FIG. 4 is a graph showing an effect of an under-cooling $\Delta T$ on normalized thickness L/2R.

The inventors have investigated an effect of an under-cooling ΔT on a normalized thickness L/2R in response to various coefficients $\mu$ of interface attachment kinetics, and discovered the relationship of the normalized thickness L/2R with the under-cooling ΔT, as shown in FIG. 4, wherein R is a critical radius of a tip of crystal growth, and a diameter do of a sample is predetermined to 5.0 mm. Since the criterion for stability of the plate-like crystal was supposed to L/2R<1.0, the ratio α was set at 0.2 under these conditions. A critical under-cooling $\Delta T_{cr}$ from the region I to II was calculated to 100K, well consistent with measured values.

Figure 5:
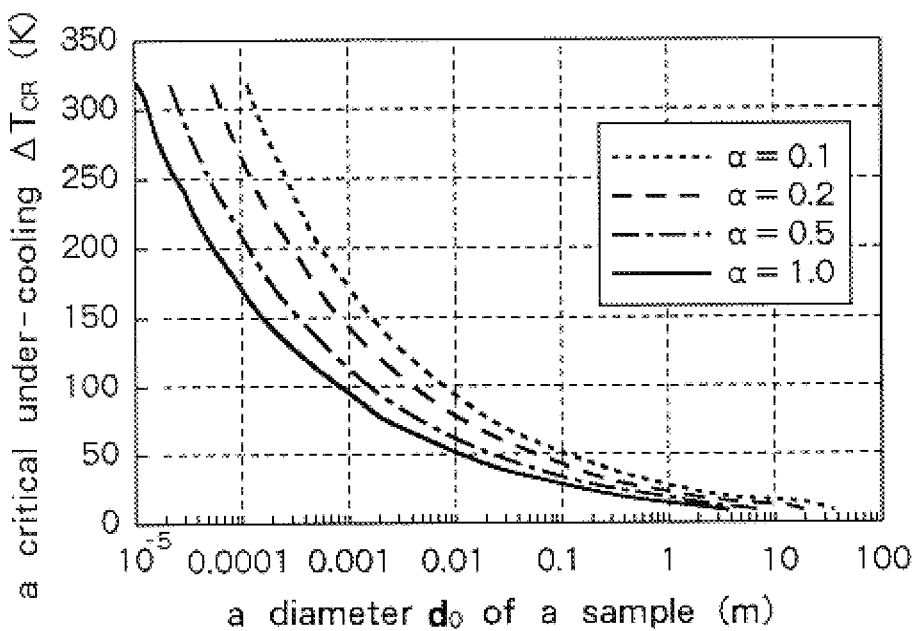
FIG. 5 is a graph showing an effect of a diameter d of a silicon droplet on a critical under-cooling $\Delta T_{cr}$ for transition from the region I to II.

The formula (4) also expresses that a critical under-cooling $\Delta T_{cr}$ for transition from the region I to II depends on a size of a sample. The inventors have confirmed from various experimental results that the critical under-cooling $\Delta T_{cr}$ decreases as enlargement of the sample, as shown in FIG. 5. It is understood from FIG. 5 that the critical under-cooling $\Delta T_{cr}$ for transition from the region I to II increases in response to minimization of the sample, and is 150K at a diameter $d_0$=1.0 mm (α=0.2) of the sample.

The above-mentioned results prove that growth of a plate-like crystal of {111} is realized by generation of a crystalline nucleus at an under-cooling ΔT less than 100K. When such the plate-like crystal is used as a substrate for crystal growth, a levitated droplet can be mono-crystallized. Growth of mono-crystalline silicon is also recognized in the following example for mono-crystallization of a sample of 5.5 mm in diameter from a levitated droplet with an aspect ratio of 0.95 or more.

Figure 6:
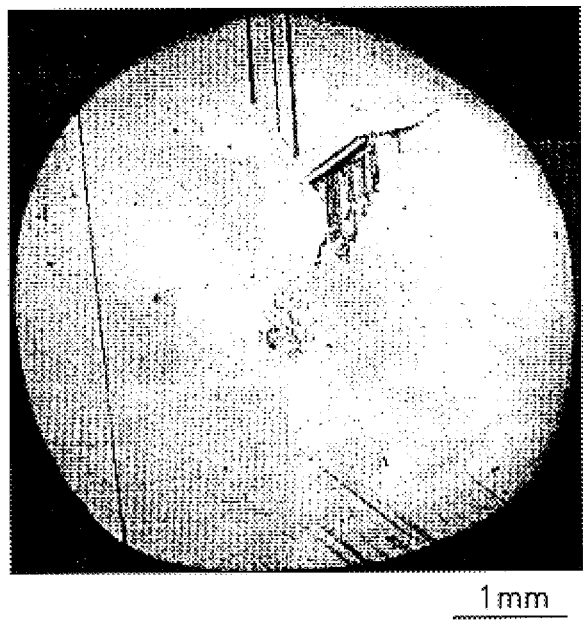
FIG. 6 is a microscopic photograph showing a cross-sectional image of a sample grown up from a crystalline nucleus generated at an under-cooling $\Delta T$ less than 26K.

A crystalline nucleus was generated from a droplet at an under-cooling ΔT less than 26K, using a seed crystal. A crystal obtained grown up from the crystalline nucleus was subjected to sectional observation with a microscope. Observation results are shown in FIG. 6. Twin was noted in two places at an upper part with occurrence of fine cracks at the starting point of twinning. The results suggest that generation of the twin relaxed stress caused by dilatational expansion at a tip of the cracks. Orientation of the twin was completely consistent with each other and there is free from any islands, so that crystallization progressed epitaxially in total from the seed crystal.

Reduction of a sample in size makes it easy to control an under-cooling ΔT, as shown in FIG. 5, and also suppresses occurrence of a twin or cracks caused by dilatational expansion during crystal growth. Accounting these effects, it is forecast that conditions for generation of mono-crystalline silicon is greatly eased by reducing the size of the sample.

EFFECT OF THE INVENTION

According to the present invention as above-mentioned, a mono-crystalline silicon ball with high quality is obtained by properly controlling an under-cooling ΔT on the basis of a critical under-cooling $\Delta T_{cr}$ in correspondence to a diameter d of a silicon droplet, without occurrence of cracks or twin which originates in dilatational expansion during crystal growth. Since the mono-crystalline silicon ball is manufactured with high reproducibility, a semiconductor material is offered as a low-cost next-generation IC.

What is claimed is:

1. A method of manufacturing a mono-crystalline silicon ball, which comprises:

generating a solidification nucleus from an under-cooled silicon droplet by controlling an under-cooling ΔT on the basis of a critical under-cooling $\Delta T_{cr}$ in correspondence with a diameter d of the silicon droplet; and growing mono-crystalline silicon to a sphere shape from the solidification nucleus at the under-cooling ΔT less than the critical under-cooling $T_{cr}$.

2. A method of manufacturing a mono-crystalline silicon ball, which comprises:

generating a solidification nucleus from an under-cooled silicon droplet, under the condition that a critical under-cooling $\Delta T_{cr}$ is determined in response to a diameter d of said silicon droplet so as to satisfy the relationships of (d=5 mm, $\Delta T_{cr}$=100K), (d=3 mm, $\Delta T_{cr}$120K) and (d=1 mm, $\Delta T_{cr}$150K) between said critical under-cooling $\Delta T_{cr}$ and said diameter d; and growing mono-crystalline silicon to a sphere shape from said solidification nucleus at an under-cooling ΔT less than said critical under-cooling $\Delta T_{cr}$.

* * * * *

UNITED STATES PATENT AND TRADEMARK OFFICE
CERTIFICATE OF CORRECTION

PATENT NO. : 6,607,593 B2
DATED : August 19, 2003
INVENTOR(S) : Kazuhiko Kuribayashi et al.

It is certified that error appears in the above-identified patent and that said Letters Patent is hereby corrected as shown below:

<u>Title page,</u>
Item [73], Assignee, "Agency of Industrial Science and Technology" should read -- The Director-General of the Institute of Space and Astronautical Science, a Japanese Government Agency --.

<u>Column 6,</u>
Line 49, "$T_{cr}$" should read -- $\Delta T_{cr}$ --.

Signed and Sealed this

Seventeenth Day of February, 2004

JON W. DUDAS
*Acting Director of the United States Patent and Trademark Office*